United States Patent [19]
Oliver et al.

[11] Patent Number: 6,114,188
[45] Date of Patent: Sep. 5, 2000

[54] METHOD OF FABRICATING AN INTEGRATED COMPLEX-TRANSITION METAL OXIDE DEVICE

[75] Inventors: Steven A. Oliver, Dedham; Paul Zavracky, Norwood; Nicol E. McGruer, Dover; Carmine Vittoria, Boston, all of Mass.

[73] Assignee: Northeastern University, Boston, Mass.

[21] Appl. No.: 08/818,106

[22] Filed: Mar. 13, 1997

Related U.S. Application Data

[60] Provisional application No. 60/015,367, Apr. 12, 1996, and provisional application No. 60/029,013, Oct. 24, 1996.

[51] Int. Cl.$^7$ ................................................ H01L 21/48
[52] U.S. Cl. .................... 438/107; 438/406; 438/409; 438/464; 438/492
[58] Field of Search ............................ 438/67, 107, 409, 438/464, 492, 406; 117/945, 946, 947

[56] References Cited

U.S. PATENT DOCUMENTS

| | | | |
|---|---|---|---|
| 4,060,448 | 11/1977 | Nemiroff et al. | 156/653 |
| 4,200,484 | 4/1980 | Glass | 156/622 |
| 4,248,675 | 2/1981 | Bozler et al. | 204/38 A |

(List continued on next page.)

OTHER PUBLICATIONS

Yokoi, H., Mizumoto, T., Maru, K. and Naito, Y. Direct bonding between InP and rare earth iron garnet grown on $Gd_3Ga_5O_{12}$ Substrate by liquid phase epitaxy *Electronics Letters*, vol. 31 No. 18, pp. 8–9.

H.L. Glass, Ferrite Films for Microwave and mm–Wave Applications, Microwave Journal, Jun., 1987, vol. 30, No. 6, pp. 52, 54, 56, 58, 60, 62, 63.

M. Abe et al., Ferrite–organic Multilayer Film for Microwave Monolithic Integrated Circuits Prepared by Ferrite Plating Based on the Spray–Spin–Coating Method, *J. Appl. Phys.*, Apr. 15, 1988, vol. 63, No. 8, pp. 3774–3776.

M. Ichinose, Single–crystal Ferrite Technology for Monolithic Disk Heads, *IEEE Transactions on Magnetics*, Nov., 1990, vol. 26, No. 6, pp. 2972–2977.

M. Levy et al., Epitaxial Liftoff of Thin Oxide Layers: Yttrium Iron Garnets Onto GaAs, *Appl. Phys. Lett.*, vol. 71, No. 18, pp. 2617–2619 (Nov. 3, 1997).

Mark J. Dalberth et al., Low Frequency Dielectric Measurements and Structural Properties of Epitoxially Lifted–Off Strantium Titanate Films, from Abstracts of the 1997 Fall Materials Research Society Meeting, Boston, MA Dec. 1–5, 1997.

M. Alexe et al., Direct Wafer Bonding and Large Area Pulsed Laser Deposition: An Innovative Way for the Integration of Ferroelectric Oxides Into Silicon Technology, from Abstracts of the 1997 Fall Materials Research Society Meeting, Boston MA Dec. 1–5, 1997.

*Primary Examiner*—Olik Chaudhuri
*Assistant Examiner*—Alonzo Chambliss
*Attorney, Agent, or Firm*—Weingarten, Schurgin, Gagnebin & Hayes LLP

[57] ABSTRACT

A method for the fabrication complex-transition metal oxide (CTMO)/semiconductor or dielectric substrate integrated devices includes the separation of the CTMO film growth process from the CTMO-film/semiconductor or dielectric substrate integration process. The CTMO-film is transferred from the native substrate to the final substrate for fabrication into devices. The CTMO-film is grown onto a native substrate under growth conditions chosen to provide a CTMO-film having desirable properties and thickness. No restrictions are placed upon the native substrate used, the growth method used, or on the growth conditions required. The CTMO-film is then joined to the semiconductor or dielectric substrate and the native substrate is removed, providing the basis for an integrated electronics, photonics, or MEMS device. Techniques fully compatible with semiconductor processing can be used to fabricate monolithically integrated CTMO/semiconductor devices in a first embodiment.

17 Claims, 3 Drawing Sheets

U.S. PATENT DOCUMENTS

| | | | |
|---|---|---|---|
| 4,371,421 | 2/1983 | Fan et al. | 156/624 |
| 4,547,622 | 10/1985 | Fan et al. | 136/249 |
| 4,624,901 | 11/1986 | Glass | 428/469 |
| 4,727,047 | 2/1988 | Bozler et al. | 438/464 |
| 4,816,420 | 3/1989 | Bozler et al. | 438/67 |
| 4,827,218 | 5/1989 | Meunier et al. | 324/252 |
| 4,837,182 | 6/1989 | Bozler et al. | 438/455 |
| 4,846,931 | 7/1989 | Gmitter et al. | 156/633 |
| 4,944,857 | 7/1990 | Adam | 204/192.15 |
| 4,970,775 | 11/1990 | Brown et al. | 29/602.1 |
| 5,034,343 | 7/1991 | Rouse et al. | 438/400 |
| 5,110,748 | 5/1992 | Sarma | 438/30 |
| 5,146,299 | 9/1992 | Lampe et al. | 257/295 |
| 5,170,137 | 12/1992 | Woembke et al. | 333/17.2 |
| 5,206,749 | 4/1993 | Zavracky et al. | 359/59 |
| 5,217,564 | 6/1993 | Bozler et al. | 156/620.71 |
| 5,227,204 | 7/1993 | Vittoria | 427/596 |
| 5,258,320 | 11/1993 | Zavracky et al. | 438/27 |
| 5,258,325 | 11/1993 | Spitzer et al. | 438/107 |
| 5,273,616 | 12/1993 | Bozler et al. | 156/603 |
| 5,300,788 | 4/1994 | Fan et al. | 257/13 |
| 5,317,236 | 5/1994 | Zavracky et al. | 315/169.3 |
| 5,328,549 | 7/1994 | Bozler et al. | 438/107 |
| 5,344,524 | 9/1994 | Sharma et al. | 156/630 |
| 5,362,682 | 11/1994 | Bozler et al. | 438/458 |
| 5,391,257 | 2/1995 | Sullivan et al. | 156/630 |
| 5,438,241 | 8/1995 | Zavracky et al. | 315/169.3 |
| 5,449,659 | 9/1995 | Garrison et al. | 505/330 |
| 5,453,153 | 9/1995 | Fan et al. | 117/2 |
| 5,493,220 | 2/1996 | Oliver et al. | 324/209 |
| 5,527,766 | 6/1996 | Eddy | 505/410 |
| 5,536,361 | 7/1996 | Kondo et al. | 156/630.1 |

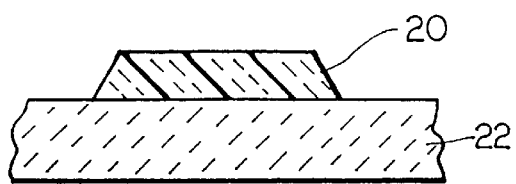
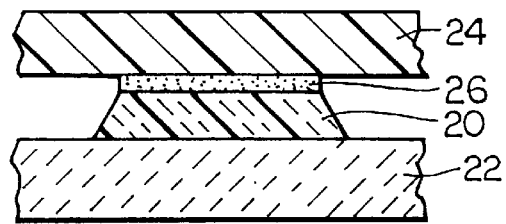
FIG. 7A
FIG. 7B
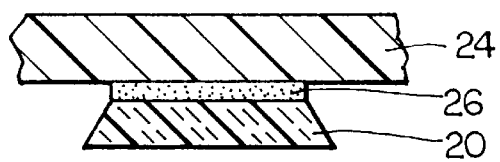
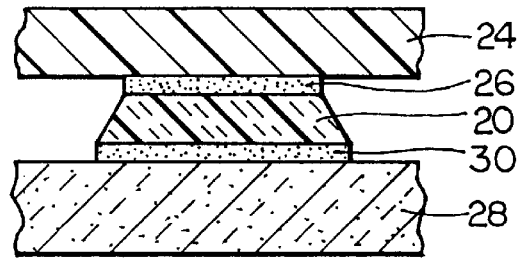
FIG. 7C
FIG. 7D
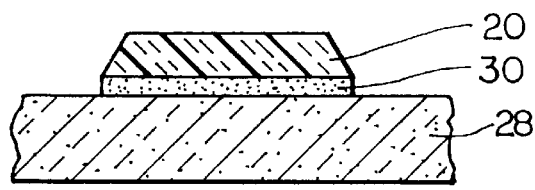
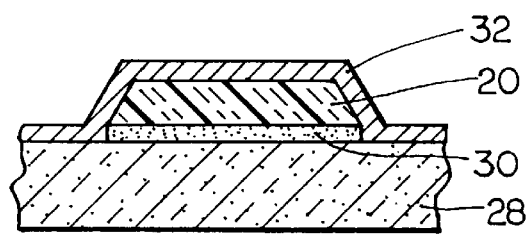
FIG. 7E
FIG. 7F
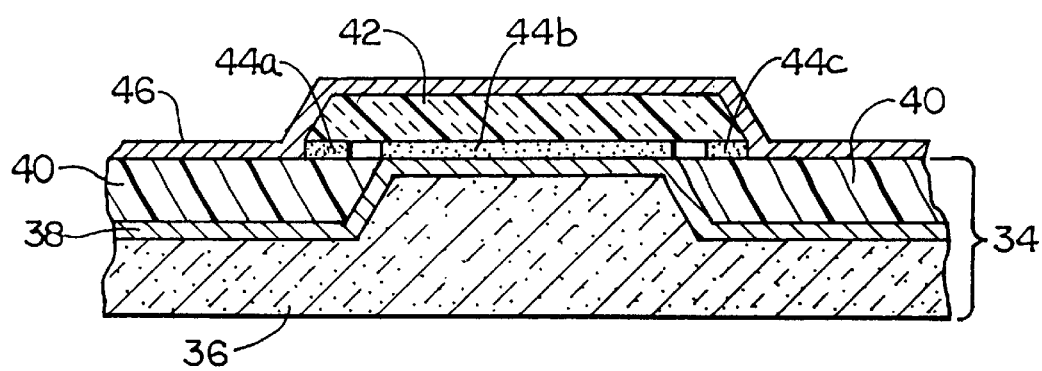
FIG. 8

METHOD OF FABRICATING AN INTEGRATED COMPLEX-TRANSITION METAL OXIDE DEVICE

This application claims priority of U.S. Provisional Application Nos. 60/015,367 and 60/029,013 filing dates Apr. 12, 1996 and Oct. 24, 1996 respectively.

CROSS REFERENCE TO RELATED APPLICATIONS

Not Applicable

STATEMENT REGARDING FEDERALLY SPONSORED RESEARCH OR DEVELOPMENT

BACKGROUND OF THE INVENTION

Complex-transition metal oxides comprise a large group of materials that show an extremely diverse and useful range of characteristics. Examples of but a few technologically useful complex-transition metal oxide materials include ferrimagnetic materials having the spinel, garnet, or hexaferrite crystallographic structures, ferroelectric materials having the perovskite crystallographic structure, and perovskites that display superconducting behavior at liquid nitrogen temperatures. All of these examples are of note because they are both of great technological interest as well as manifestations for the presence of long range cooperative order in the materials. Because of their potential impact on modern electronics, photonics, and microelectromechanical systems (MEMS) applications they are being intensively researched. However, their novel properties derive from complex crystallographic structures that heretofore have been difficult to integrate with the standard processing techniques used by the electronics, photonics and MEMS communities.

The basis of present and future trends in electronics, photonics, and MEMS involves the extension of large-scale batch fabrication of devices on semiconductor or dielectric wafer materials. Clearly, the effects of such large scale integration has yielded ubiquitous, useful devices. Unfortunately, it has thus far been difficult to integrate complex-transition metal oxide devices with current processes, where here integration is denoted as being able to fabricate both complex-transition metal oxide devices and semiconductor-based devices on the same substrate material using methods compatible with semiconductor batch processing techniques. There are many reasons why complex-transition metal oxide materials have not been integrated with semiconductor materials using standard processing techniques, including the large thermal expansion mismatches between materials, and the need to grow the complex-transition metal oxides in oxygen atmospheres at temperatures much higher than those allowable to avoid diffusion or degradation of either the wafer material or metallization layers.

It should be recognized here that the complex-transition metal oxides described in this document do not incorporate the simple oxide materials, such as $SiO_2$, $Al_2O_3$ or the many glasses that are commonly used in semiconductor processing for insulating or passivating layers. Nor does it refer to simple transition metal oxide materials, such as the conductors ZnO and $RuO_2$, which can be deposited on wafers using temperatures and processes compatible with standard semiconductor fabrication techniques. Here, the complex-transition metal oxides refer to materials having large chemical formula units and complex unit cells, and are possessed of long-ranged cooperative phenomenon such as ferrimagnetic, ferroelectric, or superconducting properties. These materials are of value for integrated devices because of the unique properties that arise from the long-ranged cooperative phenomenon, for example nonreciprocal wave propagation in ferrimagnets, very high controllable polarizabilities in ferroelectrics, and very high conductivities in superconductors. In turn, the presence of long-range cooperative phenomenon, and the quality of the resulting effects, requires the oxide film to have high structural and chemical ordering at the atomic level. Unfortunately, the process requirements needed for growing high quality complex-transition metal oxide films typically conflicts with the requirements used for producing integrated devices.

Moreover, the problems that beset integrating complex-transition metal oxide films with standard semiconductor fabrication techniques also hold for some intermetallic alloy systems that also have large chemical formulas and complex unit cells, and possess long ranged cooperative phenomenon. It would be very technologically useful to integrate intermetallics such as the rare earth-containing ternary or quarternary borides, which have very high magnetic energy products and hence are very good permanent magnets, routinely into electronics or MEMS applications.

One example of the difficulty of integrating complex-transition metal oxides and semiconductors is shown by the requirements for producing integrated ferrimagnetic garnet devices, such as circulators or phase-shifters, on semiconductor wafers for monolithic microwave integrated circuit (MMIC) applications. The performance advantages of fabricating devices such as integrated garnet/silicon circulators has been asserted for almost two decades. In using the present direct deposition method to meet this goal, high quality garnet films must be deposited at temperatures compatible with the other materials present on the wafer, i.e. below 500° C. Moreover, the garnet films must be up to 200 micrometers thick, several hundred-times thicker than most film depositions used in fabricating MMIC devices. Unfortunately, garnet films deposited at temperatures of 500° C. are structurally amorphous, and show no useful ferrimagnetic properties. It is only by growing these films at temperatures above 700° C., or by post-annealing the wafers at these high temperatures, that the garnet films become polycrystalline and thus possess useful ferrimagnetic properties. This procedure can still degrade the properties of other materials on the wafer unless great care is taken in the ordering of the total wafer fabrication process. Thus, only recently has a direct film deposition process been developed that overcomes this substantial materials problem, and others, to yield high quality integrated polycrystalline garnet/silicon circulators.

Despite the hard-won successes of the direct film deposition technique, the resulting complex-transition metal oxide films do not necessarily possess optimal material properties since they are polycrystalline, and not structurally highly-oriented or single-crystal. For most applications involving complex transition-metal oxide films, devices made with polycrystalline films have reduced performance or increased losses compared to single-crystal films. For example, devices made from polycrystalline ferrimagnetic films will have higher magnetic loss compared to the same device made from a single-crystal film, while any imperfections in a high-temperature superconducting film will reduce its current carrying capacity. Thus, in general the highest performance integrated complex-transition metal oxide devices will be produced using single-crystal oxide films.

BRIEF SUMMARY OF THE INVENTION

The method developed for the present invention intrinsically avoids the difficulties encountered by direct film deposition technique by separating the complex-transition metal oxide (CTMO) film growth process from the CTMO-film/substrate integration process. The basis of this process is the recognition that the CTMO-film can be transferred from the original, or native, growth substrate to a final, or transfer, substrate for fabrication into devices. In exemplary embodiments, this final substrate is formed of a semiconductor, dielectric, ceramic or plastic material, and may already have metallization, oxide layers, passivating layers, devices, bonding layers, or combinations of these already in place. Thus, instead of attempting to directly deposit a CTMO-film having specific material properties and thickness onto the final substrate, the CTMO-film is grown onto a native substrate under growth conditions that are chosen to provide a CTMO-film having optimal properties and thickness. No restrictions are placed upon the native substrate used, the growth method used, or on the growth conditions that are required, as long as the resulting CTMO-film has optimal parameters for the resulting device. After growing, or procuring, the CTMO-film having optimal parameters, it is then removed from the native substrate and is bonded, or joined, to the final substrate to provide the basis for an integrated electronics, photonics, or MEMS device.

A number of specific methods are available for the bonding process that produces an integrated CTMO/semiconductor or CTMO/dielectric device, all of which were originally developed for standard semiconductor processing. Considering, for brevity reasons only, that the CTMO film was to be used in an integrated CTMO/semiconductor device, the CTMO film, while still attached to its native substrate, could be bonded to the semiconductor substrate using either eutectic alloy bonding, solid state interdiffusion bonding, adhesives, van der Waal forces, anodic bonding, or other techniques known to practitioners of the art. The native substrate could then be removed by mechanical grinding or polishing, by chemical-mechanical planarization techniques, through the use of selective etches, or by a combination of these techniques with others known to practitioners. After removal of the native substrate, the CTMO film is firmly joined to the semiconductor wafer, and techniques fully compatible with semiconductor processing can be used to fabricate monolithically integrated CTMO/semiconductor devices.

BRIEF DESCRIPTION OF THE DRAWINGS

The invention will be more fully understood from the following detailed description taken in conjunction with the accompanying drawings in which:

FIGS. 7A–7F shows an exemplary process available to fabricate an integrated CTMO-film/transfer wafer device using a two transfer method; and FIG. 8 shows a self-biased monolithic circulator with a patterned bond layer, fabricated using a two transfer method.

DETAILED DESCRIPTION

Figure 1:
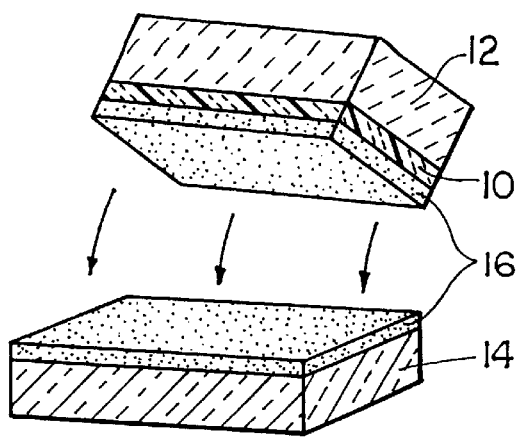
FIG. 1 shows the mating of a CTMO-film on its native substrate to a transfer wafer with bond layers on opposing faces according to the present invention.

Referring now to FIG. 1, the simplest integrated CTMO-film/semiconductor or dielectric substrate device can be fabricated by bonding an optimal CTMO-film 10, while still attached to its native substrate 12, to a wafer 14 using a bonding layer 16.

Because the properties of the CTMO-film 10 are of decisive importance in the resulting integrated film/substrate device, and because there are numerous CTMO candidates for technologically important devices, a discussion of a few prototypical ferrimagnetic, ferroelectric, and superconducting films and substrates is prudent. For most applications it is expected that the best device performance will be obtained if optimal single-crystal CTMO films are used. It is thus important to choose the native substrate 12 such that its lattice constants, crystallographic orientation, thermal expansion coefficients, and other relevant parameters well known to practitioners in the art, are appropriate for growing a CTMO-film having the specific parameters desired for the device. In addition, the choice of a growth method used for growing the single-crystal CTMO film, whether a melt-based technique such as liquid phased epitaxy, or physical vapor deposition techniques such as pulsed laser ablation deposition or sputtering, or chemical vapor techniques such as metal-organic chemical vapor deposition, or film growth techniques from solution such as sol-gel, spin-spraying, plating or hydrothermal epitaxy, is also chosen appropriately to yield the desired film characteristics, as is well known to practitioners of the art. The film growth conditions can also be freely chosen to yield films having optimal desired properties.

It should be noted that while single-crystal CTMO films have optimal properties for most applications, the methods described here are fully applicable to devices made from CTMO films having less crystallographical pure orientations, such as highly-oriented or polycrystalline films. Highly-oriented CTMO films may be interchangeable with single crystal films for most applications that use ferrimagnetic or ferroelectric CTMO materials. Polycrystalline CTMO films may prove a better choice for integrated device fabrication where cost considerations predominate, or where the device performance is insensitive to the film crystallographic orientation, or if the anisotropy intrinsic to many CTMO single-crystal films is actually detrimental to the device performance. For cases where cost considerations are paramount, the methods described here will most likely be applied with CTMO films that have sufficient, but not optimal, material properties for the integrated device. Indeed, it is the nature of the methods described here that they are independent of the nature of the CTMO film.

In addition, the methods described here are also fully applicable to those intermetallic alloys that show long range cooperative order, such as the rare-earth containing ternary or quarternary borides. Here, these intermetallic alloys are subsumed into the CTMO label for the sake of brevity.

Many specific device applications and CTMO-film/native substrate pairs 10, 12 can be found. Nonreciprocal passive microwave devices, such as circulators, are fabricated from ferrimagnetic materials that are members of the garnet, spinel, and hexaferrite families, with the appropriate material being chosen according to the device's desired operating wavelength, bandwidth, and performance level. Appropriate CTMO-film/native substrate pairs 10, 12 for these three types of materials have a yttrium iron garnet ferrimagnetic film grown on a gadolinium gallium garnet substrate, a nickel-zinc ferrite spinel film grown on a magnesium oxide substrate, or a barium hexaferrite film grown on an alumina, or sapphire, substrate. A similar range of CTMO-film/ substrate pairs 10, 12 also exist for technologically useful ferroelectric and perovskite-based superconducting films. One example is the use of lanthanum aluminate substrate for the growth of epitaxial or highly oriented films of the ferroelectric perovskite $Pb(Zr_x, Ti_{1-x})O_3$, which is often denoted as PZT. Since high-temperature superconducting oxide materials are also perovskites, lanthanum aluminate substrates are also used as their native substrate, as well as other substrates such as yttrium-stabilized zirconia or magnesium oxide.

It should not be inferred that the film 10 provided on a native substrate 12 be limited to one layer of uniform composition, or even that the film 10 itself is fixed at a single composition. The CTMO-film 10 in a further embodiment is comprised of multiple films having different compositions. For example, it has been demonstrated that the conductive oxide $(La,Sr)CoO_3$, often denoted as LSC, has a sufficient lattice match with both lanthanum aluminate and PZT films to allow growth of high quality LSC/PZT/LSC film-sandwiches on lanthanum aluminate substrates. These sandwiches 10 are thus provided on their native substrate 12, with the entire sandwich being available for removal from their native substrate and attachment to a new substrate 14, such as a semiconductor for use as a nonvolatile memory element.

Figure 2:
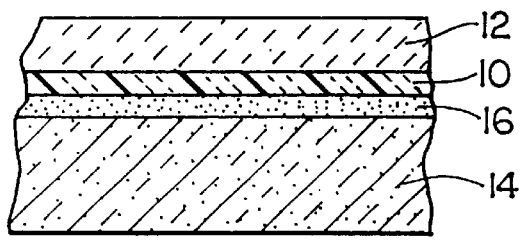
FIG. 2 shows a cross section of the bonded CTMO-film/native wafer and transfer wafer of FIG. 1.

Referring now to FIG. 2, in one straightforward fabrication process the CTMO-film/native substrate 10, 12 is bonded to the wafer 14, or surface, to which the CTMO-film is to be transferred. This bonding procedure is effected using either eutectic alloy bonding, solid-state interdiffusion bonding, adhesives, van der Waal forces, anodic bonding, or other techniques known to practitioners in the art. When adhesives, eutectic alloy bonding, or solid state interdiffusion bonding techniques are used a bond layer 16 will be present between the CTMO-film/native substrate and transfer substrate. This bond layer 16 can be placed upon either or both of the mating surfaces using standard techniques known to practitioners. The constraints on the bonding process are limited only by the desire to not damage either the transfer wafer 14 or the CTMO-film 10 by either thermal, mechanical, or chemical effects, as well as cost/ time considerations. Here the wafer surface may already have undergone considerable previous processing, and may already have integrated circuit components such as metal, insulating, or semiconducting layers and devices present.

Figure 3:
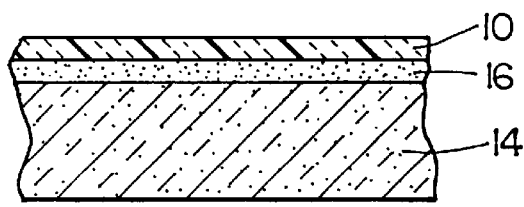
FIG. 3 shows the cross section of FIG. 2 after removal of the native substrate.

Referring now to FIG. 3, in most applications it is advantageous to remove the native substrate 12 from the bonded system, leaving the CTMO-film 10 bonded to the transfer wafer. Here the native substrate 12 is removed by one or more of the following: grinding, lapping, use of selective etching, or other techniques common to chemical-mechanical planarization processes that are well known to practitioners in the art. Since these processes are destructive of the native substrate 12, which may have a significant cost, it may be advantageous to remove the native substrate 12 without destroying it in the process. This result is obtained by breaking the bond between the CTMO-film 10 and the native substrate 12, allowing the substrate to be detached. Methods to incorporate a relatively weak bond at the film/ substrate interface can be applied either during the film growth process, or by special preparation of the native substrate 12 before undertaking the CTMO-film 10 growth. For example, it is known that during the growth of many CTMO films by vapor phase deposition techniques slight changes in the film stoichiometry through oxygen-deficiency will cause the formation of dislocation sites, which in turn promote high stress at the film/substrate interface. In practice, this yields films 10 that easily delaminate, or peel, from the native substrate 12. Thus, by appropriate modifications to the vapor phase film growth process conditions weak bonding could be obtained between the film 10 and native substrate 12, which would allow the film to be easily detached while the native substrate incurs minimal damage. Of course, the process modification must still yield CTMO films retaining sufficient properties for the integrated device.

Another method for providing a weak bond between film 10 and the native substrate 12 is obtained by depositing a sacrificial layer that has weak mechanical strength onto the native substrate 12 before growing the CTMO-film 10. One applicable method derives from the cleaved layer epitaxy for transfer, also denoted as CLEFT, process that has been developed for the epitaxial growth and transfer of semiconductors.

Figure 4:
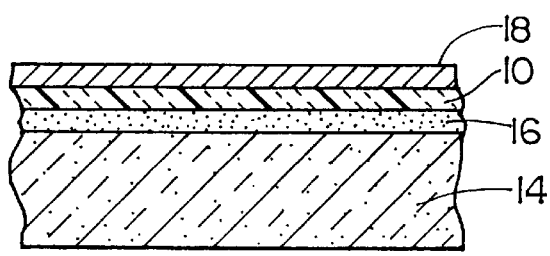
FIG. 4 shows the cross section of FIG. 2 after top layer metallization of the CTMO-film.
Figure 5:
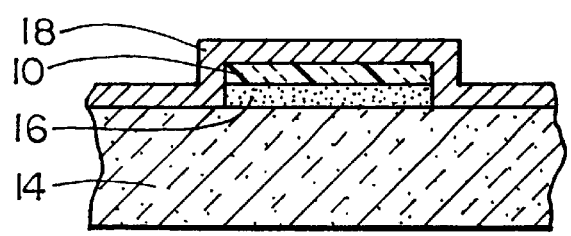
FIG. 5 shows the cross section of FIG. 2 after the CTMO-film has been patterned and etched, and then had a top-layer metallization coating deposited to yield a monolithically integrated device.

After removal of the native substrate 12, the now-exposed CTMO-film 10 is available for surface modification or patterning into devices. Referring to FIG. 4, this includes in a first embodiment polishing of the exposed surface, followed by one or more layers of metallization 18. Or, as shown in FIG. 5, the CTMO-film 10 may be patterned using standard processes well known to those in the art to yield one, or many, devices on the transfer wafer surface 14. Furthermore, the bonded CTMO-film/transfer wafer system 10, 14 is provided in a further embodiment with yet another film transferred to it, again using one of the processes listed above, to yield a complex multilayered film stack 10.

A specific embodiment of the previously described integration process is given in the following example.

EXAMPLE 1

One example for the use of the present invention involves the fabrication of integrated single-crystal yttrium iron garnet circulators on a metallized silicon substrate 14 at low temperatures. Single-crystal yttrium iron garnet (often denoted as YIG) films 10, having thicknesses over 100 micrometers, can be routinely grown on lattice-matched gadolinium gallium garnet (often denoted as GGG) substrates 12 by liquid phase epitaxy, but have never been grown on semiconductor substrates 14. As discussed previously, integrated polycrystalline garnet/semiconductor circulators have been produced through the direct fabrication method at using processing temperatures above 700° C. However, integrated single-crystal garnet circulators have performance benefits over integrated polycrystalline garnet circulators, and there is a greatly reduced risk of degrading the device characteristics if the integration is done at low temperatures.

An integrated single-crystal YIG/silicon circulator was fabricated by bonding a YIG film on its native GGG substrate to metallized silicon, followed by removal of the GGG native substrate by grinding. This was done at a chip, or die, level. Before bonding the garnet and silicon chips, the YIG surface had a 2 micrometer-thick copper layer deposited on it for use as a high-conductivity ground plane. Over this copper layer, a barrier layer of titanium-tungsten was deposited. Both chips then had layers of elemental gold and indium deposited on their mating surfaces. The relative thicknesses of the gold and indium layers were chosen such that their relative atomic fraction was approximately nine indium atoms to one gold atom. The chips were then mated, and heated in vacuum under slight compression to hold the mated faces steady. During the heating process, at a temperature of 195° C., the indium layer melts and strongly reacts with the gold layer via fast solid-liquid interdiffusion processes to yield islands of an indium-gold alloy in an indium matrix. This eutectic bonding process provided a strong bonding layer between the chips, as the indium-gold alloy has good mechanical strength, while still retaining some compliancy to stress through the indium matrix.

After bonding, the native GGG substrate was removed by mechanical grinding. The now-exposed YIG film top surface was then polished, and metallized by depositing a 2 micrometer-thick layer of copper on the top surface. The Y-junction circulator structure was then fabricated through standard semiconductor-based photolithographic and etching processes. Tests results from one of the first integrated single-crystal YIG/silicon circulators is provided in FIG. 6. The results for both the insertion loss and isolation of this circulator show noteworthy performance levels for this nonoptimized circuit.

Figure 6:
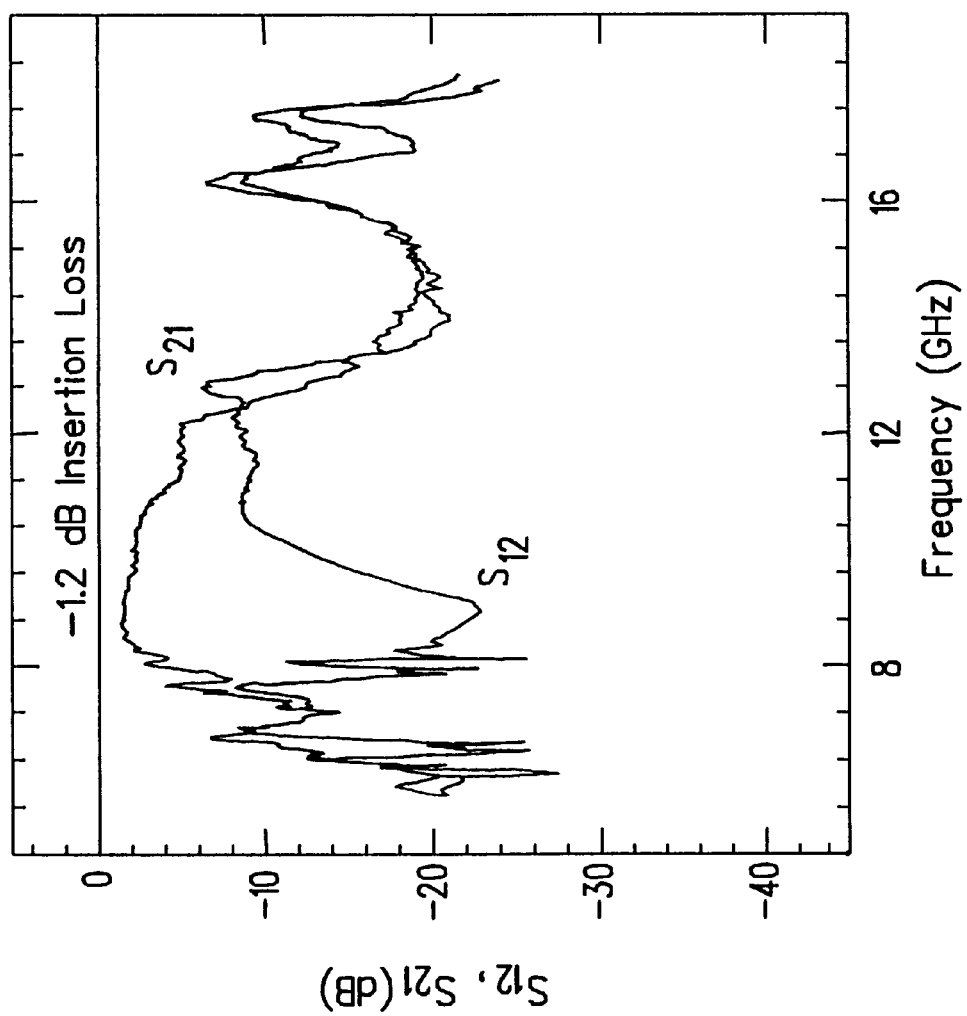
FIG. 6 shows scattering parameter data for an integrated single-crystal yttrium iron garnet film/metallized silicon circulator fabricated by the process described in Example 1 herein.

FIG. 6 shows the forward ($S_{12}$) and reverse ($S_{21}$) scattering parameters for microwave propagation across the circulator circuit and connectors as a function of frequency, where the third port of the Y-junction circulator was terminated by a 50 Ω load. The different transmitted power for the forward and reverse directions in the frequency range from 8 GHz to 12 GHz shows the nonreciprocal circulator action for this device. In particular, an isolation of over 20 dB is seen over a 1 GHz bandwidth centered near 9 GHz, with a minimum measured insertion loss of 1.2 dB.

Although the single film-transfer method described in the above paragraphs, and example, provide one straightforward method for obtaining an integrated CTMO-film/semiconductor or dielectric substrate device, multiple-step processes may prove to be advantageous where particularly sensitive devices are present on the transfer wafer, or where it is important to pattern the CTMO-film prior to bonding, or where wastage of the CTMO-film needs to be minimized due to cost considerations.

Referring to FIGS. 7A–7D, a two-step transfer process is shown where the CTMO-film disposed on a native substrate 22 is first patterned, etched, and metallized to the device specifications (FIG. 7A), and then the modified CTMO-film is bonded to a host wafer 24 (FIG. 7B), or surface, via a weak binding layer 26, before removing the native substrate 22 using any of the methods described above (FIG. 7C). At this stage, the film 20 may be further modified by patterning and etching processes, by single or multilayer metallization, or by having another film bonded to it to yield a multi-film stack. One modification may have the CTMO-film divided into discrete sub-components, where each sub-component may be bonded to different transfer substrates, or different areas of the same transfer wafer. After modification, the CTMO-film 20, or CTMO-film sub-component, is bonded to its final attachment site on the transfer wafer 28 via a bonding layer 30 (FIG. 7D), and the host wafer 24 is removed (FIG. 7E). Finally, the now-exposed surface of the modified CTMO-film 20, or multi-film stack, is further processed to yield a working device (FIG. 7F), which may be comprised of many complex film 20 and metallization 32 layers.

Although the bond layer 16 has been shown as continuous, there is no need for this layer to be contiguous other than for mechanical strength. Indeed, when metallization for electrical connections are present between the CTMO-film and transfer substrate, and a metallic alloy is used for bonding, the need for electrical isolation may necessitate a discontinuous bond layer.

FIG. 8 shows a cross-section schematic for one embodiment of this invention that can use both a patterned bond layer and a CTMO-film subcomponent fabricated by multiple transfer steps: a monolithic integrated self-biased circulator on a multicomponent transfer substrate 34. This device has great advantages over conventional circulators because the intrinsic properties of the c-axis oriented hexaferrite CTMO-film act to self-bias the circulator, such that no external magnetic field is required for circulator operation. The transfer substrate 34 may be procured as a GLASS MICROWAVE INTEGRATED CIRCUIT substrate, a trademarked product of the M/A-COM Co. This substrate 34 consists of a semiconductor wafer 36, such as silicon, a metallization layer 38 that serves as the microwave device ground plane, and a low-loss dielectric filling material 40 that provides for planarity over the substrate surface.

This embodiment of a monolithic integrated self-biased circulator entails bonding a c-axis oriented hexaferrite CTMO-film subcomponent 42, having thickness of from 20 micrometers to 100 micrometers, onto a raised silicon pedestal portion of the substrate 34 using a patterned bonding layer 44. The hexaferrite film sub-component 42 may have undergone patterning, etching, and transfer to a host wafer before bonding to the transfer substrate 34, as was shown in FIG. 7. For example, the hexaferrite film sub-component 42 may have originally been grown, or procured as a continuous film on a 75 millimeter diameter substrate, and then patterned and etched using standard processes to yield a large number of subcomponents 42, each with bevelled film edges. These individual subcomponents 42 may have triangular, rectagonal, or hexagonal shapes, and range in edge-length from 1 mm to 2 cm depending upon the particular hexaferrite material parameters, the device frequency range, and the circuit design. After patterning and etching, the hexaferrite film sub-components 42 are weakly bonded to a host substrate before attachment to the transfer substrate. Finally, the hexaferrite subcomponent 42 may be precisely aligned on the transfer substrate using pick-and-place techniques.

The bonding process of FIG. 8 may be conducted using any of the previously named methods, depending upon thermal, mechanical, time and cost considerations. However, use of a bond layer that is conductive, for example an indium-gold alloy formed by solid state interdiffusion of elemental layers, will necessitate the patterned bond layer 44. This bond layer pattern consists of several isolated bond layer pads 44a, 44b, 44c that are spaced to provide electrical isolation between the substrate ground plane metallization 38 and the device top surface metallization 46. In addition, the bond layer pads 44 must also be designed to minimize detrimental capacitance effects in the circuit.

Despite previous references to semiconductor wafers, it should not be construed that this technique is limited to the use of semiconductor transfer wafers. Dielectric materials, such as glass, are routinely incorporated into electronic circuits either as substrates, or as layers on top of the semiconductor substrate. It has heretofore proven to be difficult to grow CTMO-films directly on such glass layers, since they are crystallographical amorphous and typically melt, or soften, at temperatures below CTMO film growth temperatures. However, such glasses comprise some, or all, of the transfer wafer 14, 28 upon which the CTMO-film 10, 20 or multi-film stack is bonded in further embodiment of the present invention.

The use of this technique to transfer CTMO-films to dielectric wafers for non-electronics applications is found in yet further embodiments of the present invention. For example, using the straightforward transfer process provided in Example 1, epitaxially grown bismuth doped garnet films having high magneto-optic Verdet constants, and thus large Faraday rotation of infrared and visible light, are attached to a glass wafer for use as a magnetic field sensing element. This glass wafer may have one or more optical waveguides internal to the wafer, to provide an integrated magneto-optic sensing element. Moreover, instead of glass the transfer wafer can also be comprised of an electrooptic material.

In yet one more application of this technique, films of barium hexaferrite are heteroepitaxially grown on a native substrate such as single-crystal alumina, or sapphire, and moved using the processes described above to a glass, ceramic, or metallic platen for use as a high density magnetic storage medium for hard drives. Here, the underlying platen may already have a layer of, for example MnFe, to provide a magnetic flux closure path to yield small domain sizes in the overlying, transferred, barium hexaferrite film.

Other exemplary materials, in yet further embodiments of the present invention, include ceramic or plastic substrates, depending upon the application.

Modifications and substitutions to the present invention made by one of ordinary skill in the art is considered to be within the scope of the present invention, which is not to be limited except by the claims which follow.

What is claimed is:

1. A method of forming a monolithic integrated self-biased circulator, comprising:

providing a semiconductor wafer substrate;

patterning said semiconductor wafer substrate to form at least one raised silicon pedestal portion of said semiconductor wafer substrate;

disposing a microwave device ground plane metallization layer on said patterned semiconductor wafer substrate;

providing a low-loss dielectric filling material on regions of said ground plane metallization other than above said at least one raised pedestal portion of said semiconductor wafer substrate;

forming plural isolated bond layer pads, spaced to provide electrical isolation between said ground plane metallization and conductive components disposed on said filling material;

procuring a c-axis oriented hexaferrite CTMO-film on a host substrate;

patterning and etching said CTMO-film to form a plurality of CTMO-film subcomponents on said host substrate;

bonding at least one of said plurality of CTMO-film subcomponents on said at least one raised pedestal portion of said semiconductor wafer substrate;

removing said host substrate from said at least one CTMO-film subcomponent; and providing a device top metallization layer on said at least one CTMO-film subcomponent and said filling material not having said CTMO-film subcomponent adjacent thereto.

2. The method of claim 1, wherein said procuring further comprises:

forming said CTMO-film on a native substrate under conditions necessary for providing film properties for integrated device fabrication;

patterning and etching said CTMO-film on said native substrate;

providing said host substrate;

bonding said patterned and etched CTMO-film to said host substrate; and removing said native substrate.

3. The method of claim 2 wherein said step of forming said CTMO-film on said native substrate comprises forming a weak bond between said CTMO-film and said native substrate.

4. The method of claim 3 wherein said step of forming a weak bond comprises adjusting the oxygenation of the atmosphere in which said CTMO-film is formed on said native substrate to form dislocation sites in said bond, and wherein said step of removing said native substrate comprises peeling said CTMO-film from said native substrate.

5. The method of claim 3 wherein said step of forming a weak bond comprises forming a sacrificial layer of weak mechanical strength on said native substrate before the step of forming said CTMO-film on said native substrate.

6. The method of claim 2 wherein said step of removing said native substrate comprises a step selected from the group consisting of grinding, lapping, and etching said native substrate from said CTMO-film.

7. The method of claim 2 further comprising the step of polishing said CTMO-film after said native substrate has been removed.

8. The method of claim 2 wherein said step of forming said CTMO-film on said native substrate comprises forming by a method selected from the group consisting of melt-based deposition, physical vapor deposition, chemical vapor deposition, and film growth from solution.

9. The method of claim 8 wherein said method of melt-based deposition comprises liquid phase epitaxy.

10. The method of claim 8 wherein said method of physical vapor deposition comprises pulsed laser ablation deposition or sputtering.

11. The method of claim 8 wherein said method of chemical vapor deposition comprises metal-organic chemical vapor deposition.

12. The method of claim 8 wherein said method of film growth from solution comprises sol-gel, spin-spraying, plating or hydrothermal epitaxy.

13. The method of claim 2 wherein said step of forming comprises growing at least one single-crystal yttrium iron garnet (YIG) film on a lattice-matched gadolinium gallium garnet (GGG) native substrate.

14. The method of claim 1 wherein said step of bonding said at least one of said plurality of CTMO-film subcomponents on said at least one raised pedestal portion comprises a step selected from the group consisting of eutectic alloy bonding and solid state interdiffusion alloy bonding.

15. The method of claim 1 wherein said step of disposing a microwave device ground plane metallization layer comprises disposing a copper layer ground plane.

16. The method of claim 15 wherein said step of disposing a microwave device ground plane metallization layer further comprises depositing a titanium-tungsten barrier layer on said copper layer ground plane.

17. The method of claim 1 further comprising depositing layers of gold and indium on each of said CTMO-film and said metallized semiconductor wafer substrate prior to bonding said CTMO-film on said at least one raised pedestal portion of said semiconductor wafer substrate.

* * * * *

UNITED STATES PATENT AND TRADEMARK OFFICE
CERTIFICATE OF CORRECTION

PATENT NO. : 6,114,188
DATED : September 5, 2000
INVENTOR(S) : Steven A. Oliver, et al.

Page 1 of 1

It is certified that error appears in the above-identified patent and that said Letters Patent is hereby corrected as shown below:

Column 1,
After "STATEMENT REGARDING FEDERALLY SPONSORED RESEARCH OR DEVELOPMENT" insert -- Part of the work leading to this invention was made with United States Government funds. Therefore, the U.S. Government has certain rights in this invention. --

Signed and Sealed this

Thirteenth Day of November, 2001

Attest:

*Nicholas P. Godici*

NICHOLAS P. GODICI
*Attesting Officer*   *Acting Director of the United States Patent and Trademark Office*